(12) United States Patent
Dally et al.

(10) Patent No.: US 6,728,240 B1
(45) Date of Patent: Apr. 27, 2004

(54) SERIAL-LINK CIRCUIT INCLUDING CAPACITIVE OFFSET ADJUSTMENT OF A HIGH-SPEED RECEIVER

(75) Inventors: William J. Dally, Stanford, CA (US); Ming-Ju Lee, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/498,413

(22) Filed: Feb. 4, 2000

(51) Int. Cl.[7] ............................................. H04L 12/50
(52) U.S. Cl. ...................... 370/366; 370/503; 370/284
(58) Field of Search ................................. 327/407, 408, 327/410, 412, 413, 415, 416, 417; 370/537, 542, 916, 284, 366, 503; 307/6, 37, 58

(56) References Cited

U.S. PATENT DOCUMENTS 5,675,584 A * 10/1997 Jeong .......................... 370/284

OTHER PUBLICATIONS

Chih–Kong Tang et al., "A 0.5 CMOS 4.0–Gbit/s Serial Link Transceiver with Data Recovery Using Oversampling", IEE Journal of Solid–State Circuits, vol. 33, No. 5, May 1998 pp. 713–722.*
Willaim J. Dally et al., Abstract of "Transmitter Equalization for 4Gb/s Signalling" 10 pp.
Chih–Kong Ken Yang et al., "A 0.5–μm CMOS 4.0–Gbit/s Serial Link Transceiver with Data Recovery Using Oversampling", IEEE Journal of Solid–State Circuits, vol. 33, No. 5, May 1998, pp. 713–722.
Ramin Farjad–Rad et al., "A 0.4–μm CMOS 10 Gb/s 4–PAM Pre–Emphasis Serial Link Transmitter", IEEE Journal of Solid–Stare Circuits, vol. 34, No. 5, May 1999, pp. 580–585.
Alan Fiedler et al., "A1.0625 Gbps Transceiver with 2x–Oversampling and Transmit Signal Pre–Emphasis", IEEE International Solid–State Circuits Conference Digest of Technical Papers, First Edition, Feb. 1997, pp. 238, 239, 464.
James Montanaro et al., "A 160–MHz, 32–b, 0.5–W CMOS RISC Mircroprocessor", IEEE Journal of Solid–State Circuits, vol. 32, No. 11, Nov. 1996. pp. 1703–1714.

* cited by examiner

*Primary Examiner*—Douglas Olms
*Assistant Examiner*—Robert W. Wilson

(57) ABSTRACT

A serial link circuit includes a transmitter which multiplexes the circuit's input signals together and uses a single processing circuit to generate a multiplexed output to be transmitted. The multiplexing is done with a limited voltage swing prior to preamplification. In this way, clock loading (and hence clock buffer area), power and jitter are significantly reduced. The complementary link receiver includes a demultiplexer implemented with sense amplifiers that are digitally unbalanced using trimmer capacitors to cancel the receiver's offset voltage. This allows the receiver to be implemented using very small elements to save power, and enables the link to operate reliably with a very low signal swing.

15 Claims, 7 Drawing Sheets

SERIAL-LINK CIRCUIT INCLUDING CAPACITIVE OFFSET ADJUSTMENT OF A HIGH-SPEED RECEIVER

STATEMENT REGARDING FEDERALLY SPONSORED RESEARCH OR DEVELOPMENT

The U.S. Government retains certain rights in this application pursuant to DARPA contract number DABT-63-96-C-0039.

FIELD OF THE INVENTION

The present invention is directed to serial communication systems, and is more particularly directed to serial link circuits designed to be replicated and integrated with one another on a silicon chip to enable a large number of independent input/output operations to be conducted simultaneously.

BACKGROUND

Prior art serial links such as CMOS serial links intended to operate at multi-gigabit signaling rates over several meters of cable have been developed; however, such links typically require large amounts of power and chip area. This makes them unsuitable for applications such as high bandwidth switch fabrics, multicomputer routers and telecommunication crossbar chips which require hundreds of simultaneous, independent input/output operations per chip. For example, the best known power and size figures for serial links operating above 4 Gb/s are 310 mW and 0.6. mm$^2$. The integration of 100 such serial links on a chip would create a device which consumes more than 30 Watts and occupies 60 mm$^2$ of chip area.

SUMMARY OF THE INVENTION

For these reasons, there is a need in the art for a serial link circuit design which occupies only a small amount of area on a semiconductor chip.

There is an additional need for a serial link circuit design which consumes a minimum amount of power.

There is a further need for a chip exhibiting these properties which is relatively insensitive to power supply jitter and the like.

There is also a need for a chip exhibiting these properties which is more sensitive than chips employing receivers without offset cancellation.

There is an additional need for a chip exhibiting these properties which has better cancellation characteristics than circuits employing receivers with current trimming.

Various embodiments are disclosed which address one or more of the above advantages. One example embodiment of the present invention is directed to providing a serial link circuit that includes a transmitter which multiplexes the circuit's input signals together and uses a single processing circuit to generate a multiplexed output to be transmitted. This is in contrast to prior art designs which duplicatively process a number of separate input signals and then multiplex the processed signals together at their output.

The objects are further achieved by providing a serial link circuit in which the transmitter multiplexes its input signals with a limited voltage swing prior to preamplification. In this way, clock loading (and hence clock buffer area), power and jitter are significantly reduced compared to prior art circuits which preamplify unmultiplexed input signals.

These objects are additionally achieved by implementing a serial link receiver using very small elements, thereby leading to a high input offset voltage which is then cancelled using capacitive trimming.

BRIEF DESCRIPTION OF THE DRAWINGS

These and other advantages of the present invention will more readily be appreciated in light of the following description taken in conjunction with the appended drawings, in which.

DETAILED DESCRIPTION

Figure 1:
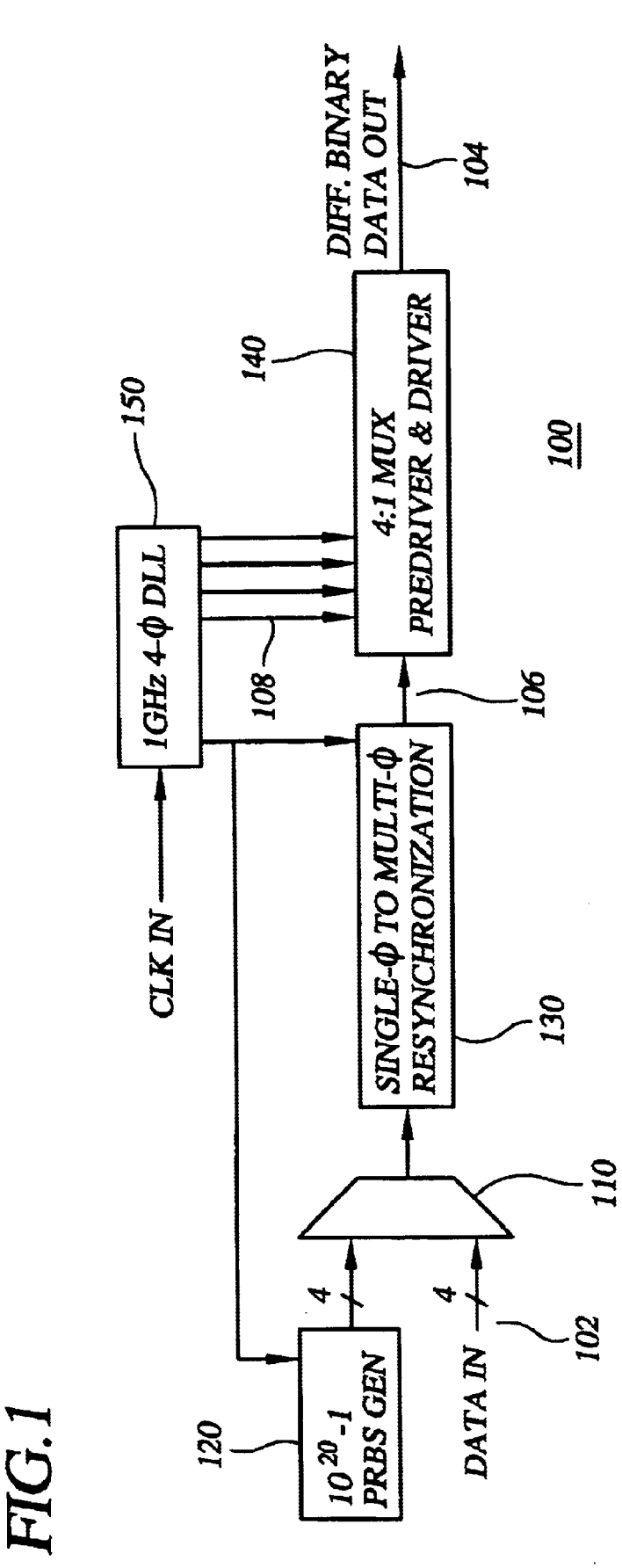
FIG. 1 is a block diagram of a serial link transmitter according to a preferred embodiment of the present invention.

A serial link transmitter 100 according to a preferred embodiment of the present invention is shown in FIG. 1. Here, a multiplexer 110 receives four bits of input data 102 along with four bits from a pseudo-random binary sequence (PRBS) generator 120 and selects one of the four bit wide inputs for further processing. This multiplexer 110 allows the choice of inputs from the scan chain interface, or from the PRBS encoder 120 for test and measurement purposes. The output of the multiplexer 110 is fed to a single-to-multiphase resynchronization circuit 130 which eases the timing constraints on parallel-to-serial conversion by aligning each bit of data with the appropriate phase of the clock signal so that it can be multiplexed using the four phases of the clock signal. It provides the result to a 4:1 multiplexer, preamplifier and driver circuit 140. As will be explained in greater detail below, the mux/preamp/driver circuit 140 is driven by four evenly-spaced clock signals 108 generated by a delay-locked loop 150 to generate a balanced differential binary output 104 which, using techniques known in the art, is then transmitted over an appropriate medium (in the preferred embodiment 24 AWG cables, although other equivalent media will be readily apparent to those skilled in the art).

Figure 2:
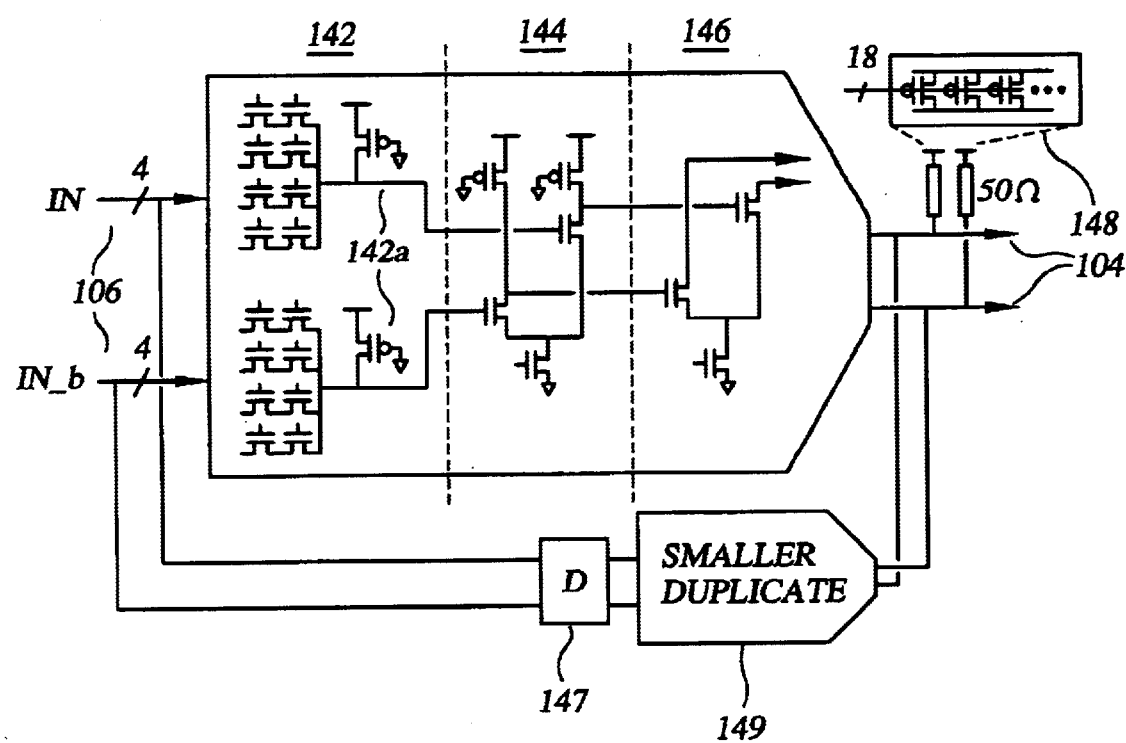
FIG. 2 shows details of the multiplexer predriver and driver of FIG. 1.

As seen in FIG. 2, the mux/preamp/driver circuit 140 receives a four bit wide differential binary input 106 from the single-to-multiphase resynchronization circuit 130, and its NFET multiplexer section 142 is driven by the four clock signals 108 from the delay-locked loop 150 to serialize the four bit wide input stream 106 onto the differential input of a preamplifier 144 within the mux/preamp/driver circuit 140. The series NFETs of the 4:1 mux are turned on and off by adjacent clock phases so each input is connected to the output during only one clock phase. More specifically, during the quarter period when phase 1 first goes high (and hence phase 2 is low), the two FETs on the first input of the multiplexer 142 are on and all other pairs are off; hence, the multiplexer 142 selects the first input during phase 1. Similarly, the second input is selected during phase 2, and so on.

The multiplexer 142 output preferably has two PFETs 142a which clamp the multiplexer's output to limit its swing to a predetermined value (in the preferred embodiment, 0.6 V) and extend its bandwidth beyond the preferable unity gain bandwidth of the transmitter. The preamplifier 144 in turn reduces the input impedance to a driver stage 146 by a predetermined amount (in the preferred embodiment, by a factor of 3). Finally, the driver 146 outputs the resultant signal as the differential binary output 104 into the transmission line (in the preferred embodiment, with a peak magnitude of 20 mA). To provide accurate 50 ohm termination across process and voltage variation, eighteen parallel PFETs at the output of the transmitter are trimmed at run time to the desired value.

In order to transmit over more than 10 meters of 24 AWG copper cables (or any copper wire with similar frequency-dependent attenuation characteristics), a two-tap FIR pre-emphasis filter with adjustable coefficients is integrated with the transmitter. The inputs are delayed (indicated by reference numeral 147 in FIG. 2) and driven by a smaller duplicate 149 of the above mentioned mux/preamp/driver circuit to form the second tap. The outputs of the first tap and the second tap are summed directly at the output.

The input-multiplexed transmitter 140 described above has a number of advantages compared to output-multiplexed designs of the prior art. For example, it greatly reduces required chip area since only a single copy of the relatively large output driver 146 is needed. Also, the clock load and hence clock buffer area, power and jitter are greatly reduced in comparison with prior art designs by multiplexing lower-energy signals before the preamplifier 144 and limiting the swing of multiplexer 142 using PFETs 142a. A result of this is that the clock load of the transmitter 140 is on the order of 60 fF per phase, or about one tenth that of an output-multiplexed architecture with comparable drive.

Figure 3:
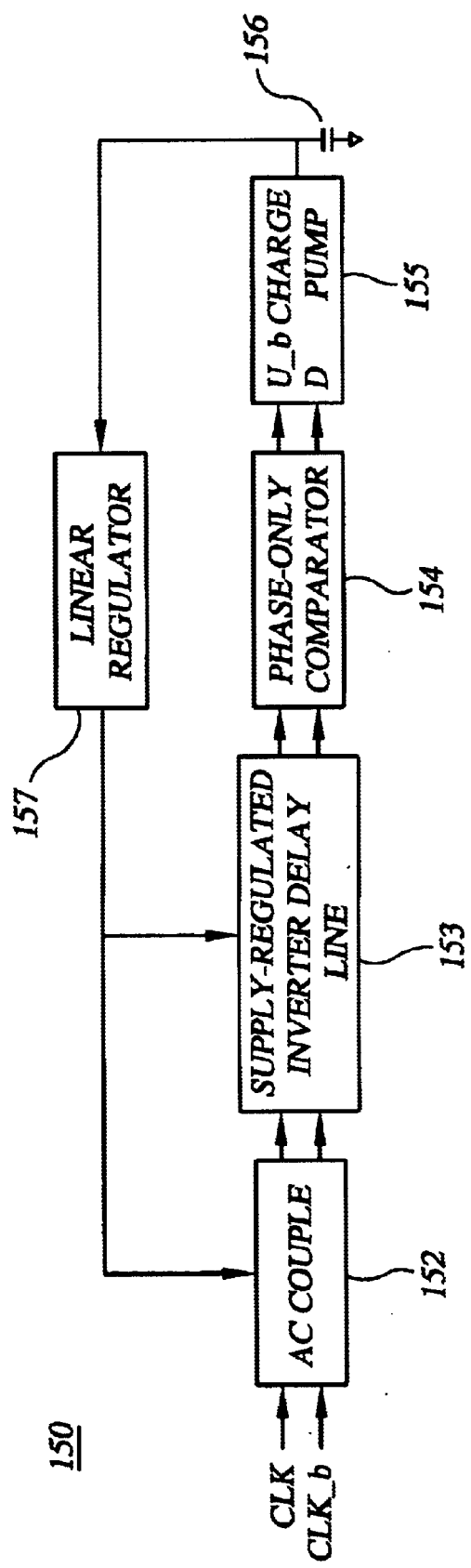
FIG. 3 is a block diagram of the delay-locked loop used in the circuit of FIG. 1.
Figure 4:
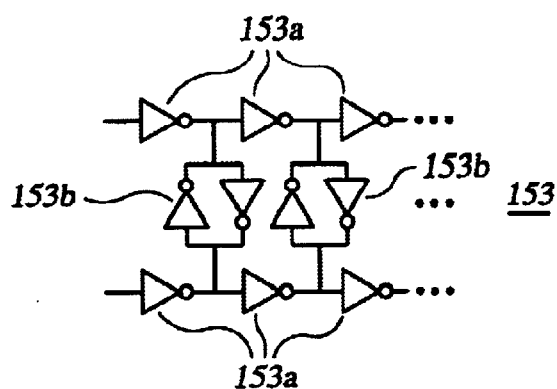
FIG. 4 shows details of the inverter delay line used in the circuit of FIG. 3.
Figure 5:
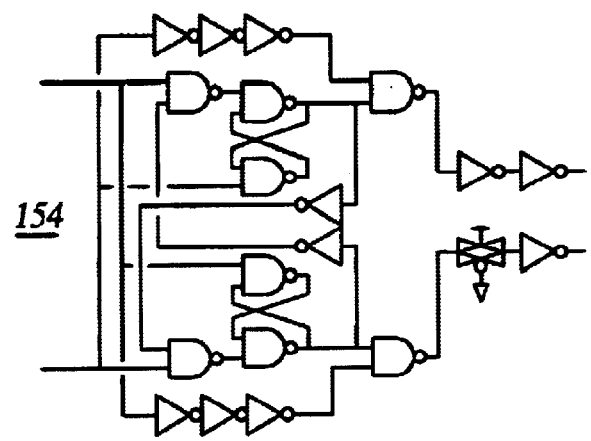
FIG. 5 shows details of the phase-only comparator used in the circuit of FIG. 3.
Figure 6:
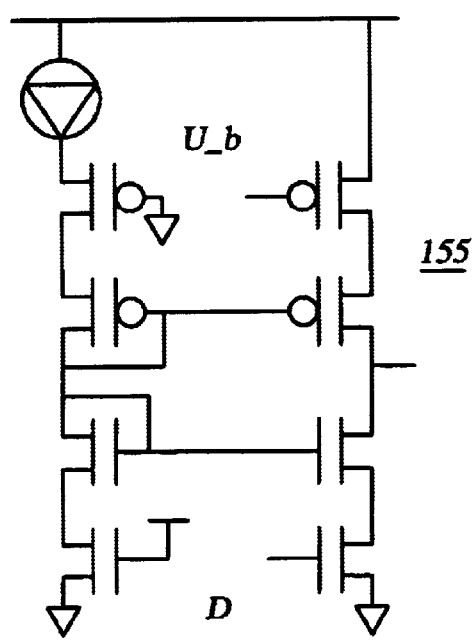
FIG. 6 shows details of the charge pump used in the circuit of FIG. 3.
Figure 7:
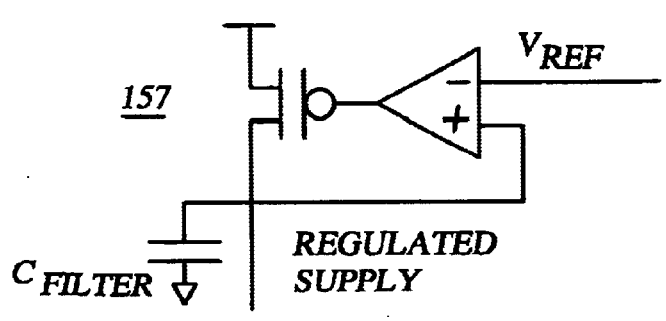
FIG. 7 shows details of the linear regulator used in the circuit of FIG. 3.

FIG. 3 shows a more detailed structure of the delay-locked loop 150 of FIG. 1. The delay-locked loop 150 is a CMOS inverter-based DLL with a regulated power supply 157. In this circuit, a 1 GHz clock signal CLK and its complement CLK_b from an external circuit (not shown) are presented to an AC coupler 152 which centers the common mode of the inputs to the inverter delay line 153 and avoids phase imbalances. The filtered signals are passed to the inverter delay line 153 which uses parallel chains of inverters 153a as shown in FIG. 4 to produce the clock signals supplied to the mux/preamp/driver 140. The inverter chains 153 are cross-coupled with weak inverters 153b to minimize skew in the resultant clock signal. If the complementary clock signals are slightly skewed, the cross-coupled inverters 153a, being forced to have the same voltage at the two sides, will try to pull back the faster signal and advance the slower signal. The amount of delay in the delay line 153 is controlled by adjusting the supply voltage delivered by a linear regulator 157, shown in more detail in FIG. 7.

The supply rejection of the linear regulator 157 reduces supply noise sensitivity of clock jitter to a measured 0.08 ps/mV peak-to-peak in laboratory test measurements. Also, since there is no static current in the delay line, the DLL 150 has lower power consumption than typical prior art DLLs. Further, it provides lower supply sensitivity to jitter when compared to prior art DLLs using source-coupled stages.

The delay line outputs 157 are provided to a phase-only detector 154 which pulses either up_b or down if the 0 degree and 180 degree phases are not exactly aligned. This type of phase-only comparator, which differs from the 3-state phase-frequency comparator commonly used in PLLs, avoids false locking with an incorrect startup state. The charge pump 155 takes the up_b and down outputs from the phase-only detector 154 and increases or decreases the control voltage for the delay line 153. The capacitor at the output of the charge pump 155 is for stability compensation purposes. Note that the up_b and down inputs of the charge pump are moved outside the current source transistors to minimize input feed-through to the output when up_b/down pulses.

Figure 8:
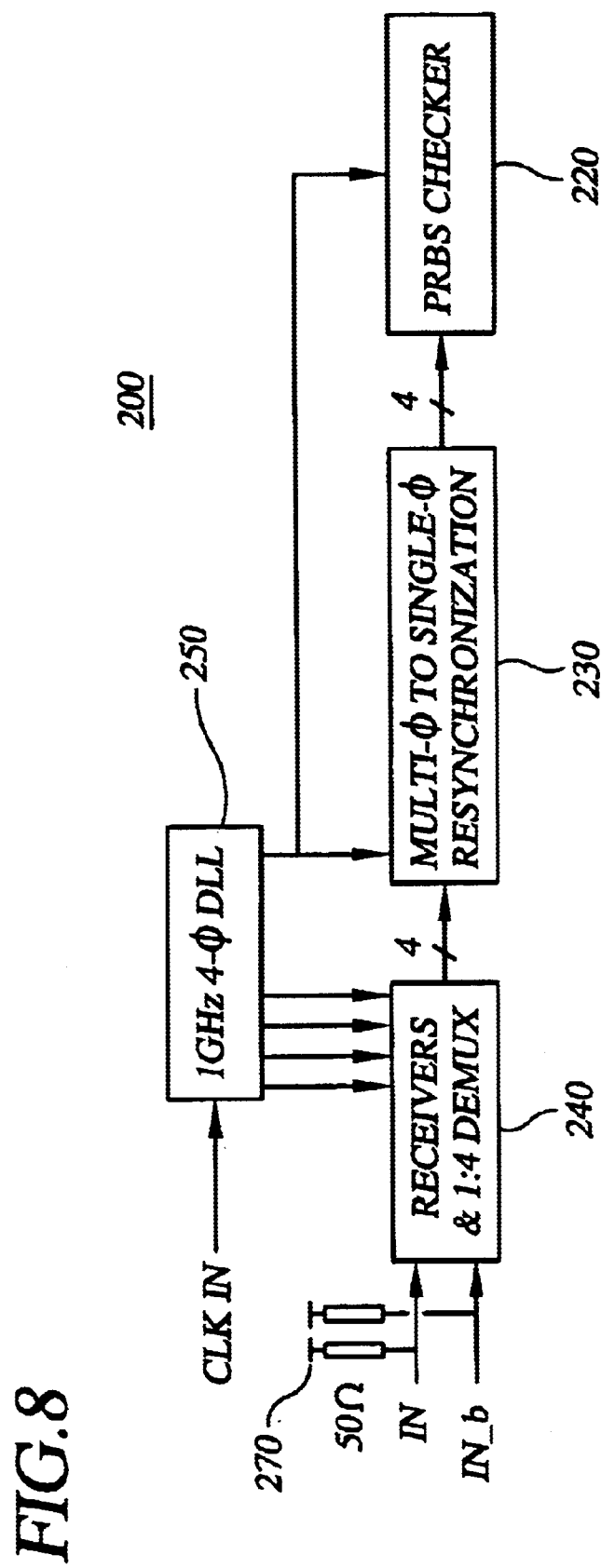
FIG. 8 is a block diagram of a serial link receiver according to the preferred embodiment.
Figure 9:
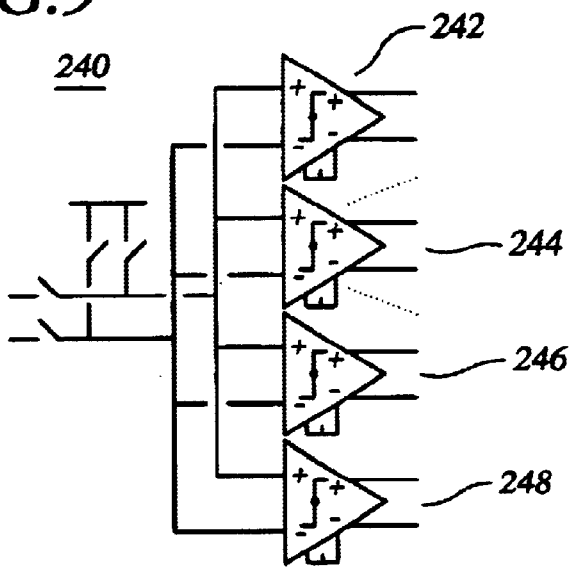
FIG. 9 shows details of the receiver and demultiplexer used in the circuit of FIG. 8.
Figure 10:
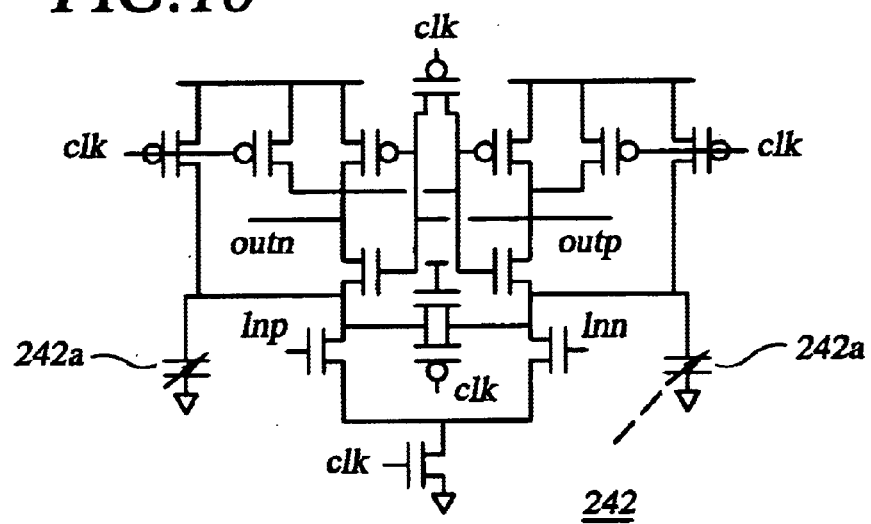
FIG. 10 shows details of one of the sense amplifiers used in the circuit of FIG. 9.
Figure 11:
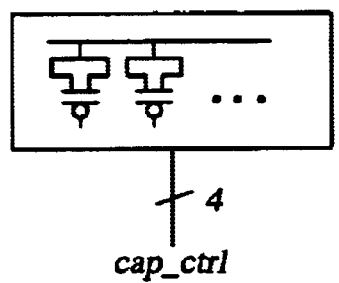
FIG. 11 shows details of one of the trimming capacitors used in the circuit of FIG. 10.

A receiver 200 complementary to the transmitter 100 is shown in FIG. 8. Here, serial data received at complementary inputs In and In_b are demultiplexed with four sense amplifiers 242–248 as shown in FIG. 9. The sense amplifiers 242–248 are sequenced by four clock phases generated by a receiver-side delay-locked loop 250 similar to the transmit delay-locked loop 150. As shown in FIG. 10, each sense amplifier (amplifier 242 is illustrated) is trimmed by placing binary-weighted PMOS capacitors 242a on the two integrating nodes of the amplifier. By digitally adjusting the capacitances 242a which are shown in greater detail in FIG. 11, the amplifier can be unbalanced to cancel any offset voltages present.

This is done as follows. The input amplifiers initially act as integrators converting the differential input voltage $\Delta V_{in}$ into a pair of currents $i_1$ and $i_2$ and integrating these currents on the capacitance of the drain nodes of the input pair, $C_1$ and $C_2$. The voltage $\Delta V_{sense}$ across these nodes after time dt is $$\Delta V_{sense} = \frac{i_1}{C_1} dt - \frac{i_2}{C_2} dt$$

Thus, the integrator can be unbalanced and an offset effected by varying C1 and C2.

More specifically, during startup of the link, the inputs to all receivers 200 are shorted together, and control logic (not shown) switches the trimming capacitors toward its metastable state to minimize the offset. Simulations show that adjusting the capacitors in this way can introduce up to ±120 mV of offset in 8 mV steps. With digital bang-bang control, the worst case offset after cancellation is 8 mV with any untrimmed offset less than 120 mV. The simulated input sensitivity of the receiver is 0.8 mV.

Canceling offset voltages in this manner saves power by allowing the sense amplifiers 242–248 to use very small devices and by allowing the serial link to operate reliably with a very low signal swing. The single to multi-phase resynchronization circuit, similar to the one on the transmitter side, eases the timing constraints of serial to parallel conversion by taking the output of the four input amplifiers which are aligned with the four clock phases and realigns them all with a single clock phase. As before the PRBS checker is used for a self-test and is used-to check the received sequence to determine if it is a legal sequence generated by the PRBS generator in the transmitter.

Figure 14:
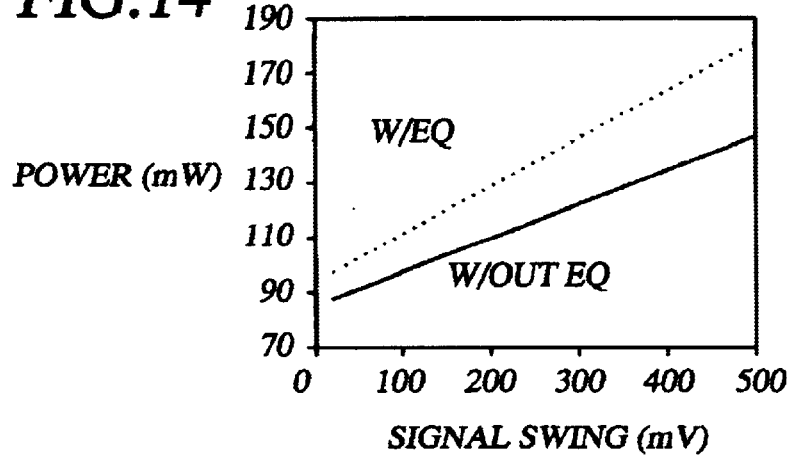
FIG. 14 shows power versus signal swing in the preferred embodiment.

Preferably, the serial link transmitter 100 and receiver 200 are fabricated in National Semiconductor's 0.25 μm CMOS technology or an equivalent. A test chip fabricated in this technology contained a single link with one DLL each on the transmitter side and the receiver side along with supporting test circuits. Full clock recovery was not implemented. The active area of the transceiver and DLLs was 0.08 mm$^2$, with an additional 0.13 mm$^2$ occupied by the offset-calibration control logic. Operating from a 2.5 V supply at 4 Gb/s with an output voltage swing of 20 mV and bit error rate well below $10^{-14}$, the entire link dissipated 88 mW without pre-emphasis and 98 mW with pre-emphasis. The power consumption versus signal swing of this circuit is shown in FIG. 14. Computer simulation of the circuit indicates that 7 mW of the power consumed by the circuits is due to the PRBS generator 120 and PRBS checker 220.

TABLE I summarizes the measured performance of this test chip (note that "OC Synthesized Logic" is the control logic for offset cancellation).

TABLE I

| | |
|---|---|
| Process | National 0.25 μm CMOS N-well |
| Nominal Supply | 2.5 V |
| Maximum Speed | Tx: 5.3 Gb/s; DLL: 5.3 Gb/s; Rx: 4 Gb/s |
| Power @ 2.5 V, 4 Gb/s, 20 mV Swing | Tx Driver & Test Logic w/o Eq.: 20 mW |
| | Tx Driver & Test Logic w/ Eq.: 30 mW |
| | 2 DLL: 50 mW |
| | Rx Input Samplers & Test Logic: 18 mW |
| Bit Error Rate @ 4 Gb/s, 20 mV Swing | $<10^{-14}$ |
| Active Area | Tx Driver & Test Logic: 160 × 200 μm$^2$ |
| | DLL: 120 × 200 mm$^2$ |
| | Rx Input Samplers & Test Logic: 160 × 200 μm$^2$ |
| | OC Synthesized Logic: 820 × 160 μm$^2$ |
| Receiver Timing Window | 220 psec |
| Minimum Swing @ 4 Gb/s | 8 mV (for bit error rate $<10^{-13}$) |
| Jitter (Quiet Supply) @ 4 Gb/s | 16.5 ps (peak-to-peak) |
| Jitter Supply Sensitivity @ 4 Gb/s | 0.08 ps/mV |

Figure 12:
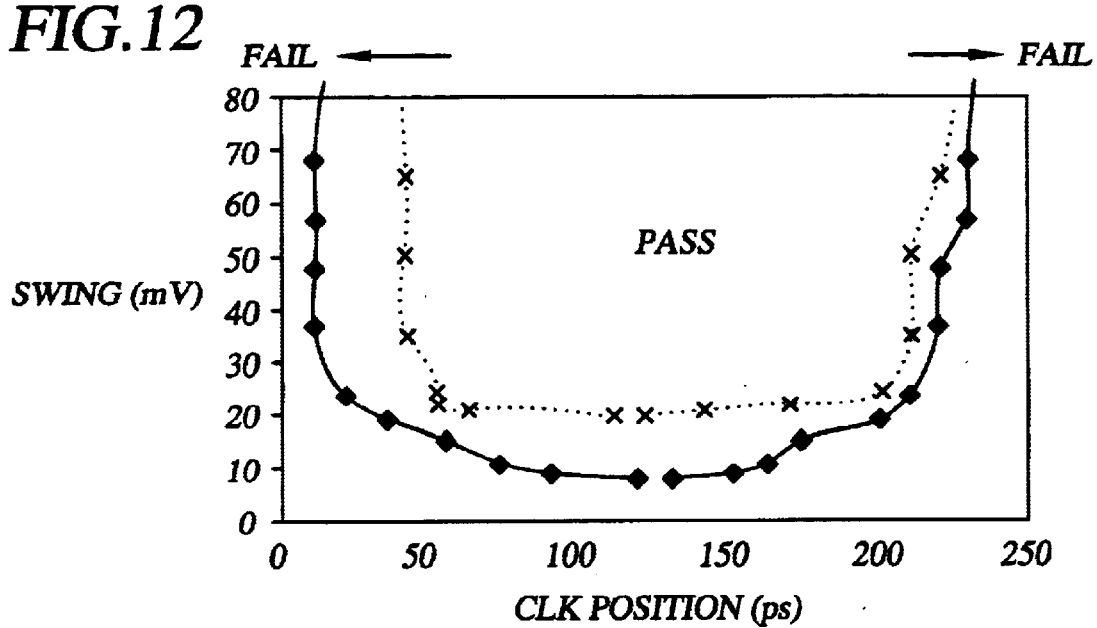
FIG. 12 shows the timing margin in the receiver of the preferred embodiment.

As shown in FIG. 12, with offset cancellation as described above, the receiver 200 is able to operate down to 10 mV of signal swing with a timing margin of 80 ps at 4 Gb/s. The solid line in FIG. 12 shows the voltage and timing margin with offset calibration, and the dashed line shows the voltage and timing margin without offset calibration. The dotted line shows that the untrimmed receiver offset is only 20 mV with a 3σ offset of 60 mV. As seen from this plot, offset calibration is able to reduce the offset voltage to less than 8 mV and add 40 ps of timing margin to this circuit.

Figure 13:
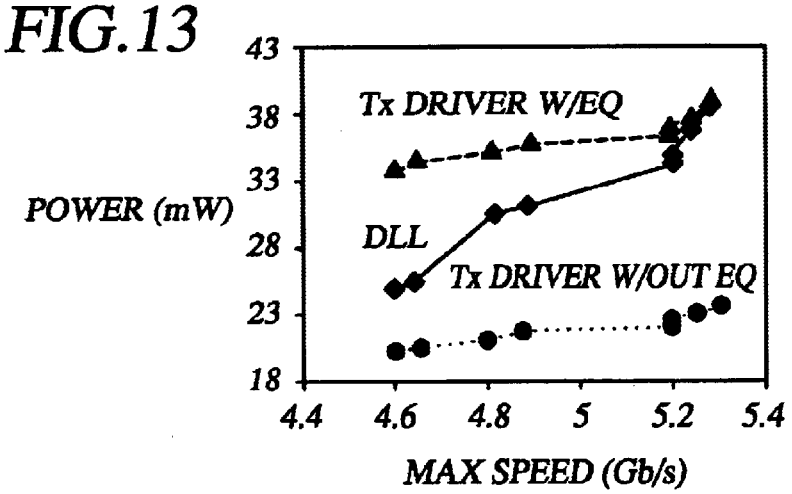
FIG. 13 shows power versus maximum speed in the preferred embodiment.

Finally, FIG. 13 shows power versus maximum speed for the transmitter 100 and delay locked loop with supplies ranging from 2.5 V to 2.85 V. The transmitter 100 and delay locked loop operate up to 4.6 Gb/s at 2.5 V and up to 5.3 Gb/s at 2.85 V. The receiver is not shown on the graph of FIG. 13 but is limited to 4 Gb/s because of a speed path in the PRBS checker 220.

The present invention has been described above in connection with a preferred embodiment thereof, however, this has been done for purposes of illustration only, and the invention is not so limited. Indeed, variations of the invention will be readily apparent to those skilled in the art and also fall within the scope of the invention.

What is claimed is:

1. A receiver for a serial link circuit, the receiver comprising:

a demultiplexer for receiving serial data and demultiplexing it to generate parallel data therefrom; and a clock for generating clock signals to drive the demultiplexer;

wherein the demultiplexer includes a plurality of sense amplifiers, at least one of the sense amplifiers including a capacitor which unbalances the amplifier to minimize an offset voltage within the amplifier.

2. The receiver of claim 1, further comprising a resynchronization circuit for receiving the parallel data and resynchronizing the data.

3. The receiver of claim 1, wherein the capacitor in the at least one of the sense amplifiers is a binary-weighted PMOS capacitor.

4. The receiver of claim 1, wherein the capacitor in the at least one of the sense amplifiers is connected to an integrating node of the sense amplifier.

5. The receiver of claim 1, wherein the at least one of the sense amplifiers additionally includes another capacitor connected at a position complementary to the first capacitor.

6. The receiver of claim 1, wherein the clock is a delay-locked loop.

7. The receiver of claim 1, wherein the clock is for generating a plurality of evenly-spaced signals to drive individual channels of the demultiplexer.

8. The receiver of claim 1, further comprising a resynchronization circuit for receiving the parallel data and resynchronizing the data and a PRBS checker for receiving resynchronized parallel data from the resynchronization circuit and a signal from the clock.

9. A transmitter for a serial link circuit, the transmitter comprising:

a resynchronization circuit for receiving parallel data and resynchronizing it;

a processing circuit including a multiplexer adapted to receive the resynchronized parallel data and multiplex it to produce serial data and to limit its output voltage swing, and including a driver for receiving the serial data from the multiplexer and driving a serial line responsive thereto; and a clock for generating clock signals to drive the resynchronization circuit and the processing circuit.

10. The transmitter of claim 9, wherein the clock is for generating a plurality of evenly-spaced signals to drive individual channels of the multiplexer.

11. The transmitter of claim 9, further comprising a PRBS generator for generating data to be provided to the resynchronization circuit and a signal from the clock.

12. A transmitter for a serial link circuit, the transmitter comprising:

a resynchronization circuit for receiving parallel data and resynchronizing it;

a processing circuit including a multiplexer adapted to receive the resynchronized parallel data and multiplex it to produce serial data, and including a driver for receiving the serial data from the multiplexer and driving a serial line responsive thereto;

a clock for generating clock signals to drive the resynchronization circuit and the processing circuit;

a PRBS generator for generating data to be provided to the resynchronization circuit and a signal from the clock; and a switch for selectively providing data generated by the PRBS generator and input data from an external source to the resynchronization circuit.

13. A transmitter for a serial link circuit, the transmitter comprising:
- a resynchronization circuit for receiving parallel data and resynchronizing it;
- a processing circuit including a multiplexer for receiving the resynchronized parallel data and multiplexing it to produce serial data, and including a driver for receiving the serial data from the multiplexer and driving a serial line responsive thereto; and
- a delay-locked loop clock for generating clock signals to drive the resynchronization circuit and the processing circuit, the delay-locked loop clock including an AC coupler circuit, a FET-type inverter-based delay circuit responsive to AC-coupled signals provided by the AC coupler circuit, a phase comparator adapted to respond to the FET-type inverter-based delay circuit, and a regulated power supply adapted to provide regulated power to the AC coupler circuit and to the FET-type inverter-based delay circuit, wherein signal delay provided by the FET-type inverter-based delay circuit is controlled by adjusting a supply voltage delivered to the regulated power supply.

14. The transmitter of claim 13, wherein the phase comparator provides an output signal having only two states.

15. The transmitter of claim 13, wherein the AC coupler circuit is adapted to provide common mode centering to the AC-coupled signals.

* * * * *

UNITED STATES PATENT AND TRADEMARK OFFICE
CERTIFICATE OF CORRECTION

PATENT NO. : 6,728,240 B1
DATED : April 27, 2004
INVENTOR(S) : Dally et al.

It is certified that error appears in the above-identified patent and that said Letters Patent is hereby corrected as shown below:

Title page,
Item [73], Assignee, "The Board of Trustees of the Leland Stanford Junior University, Palo Alto, CA (US)" should read -- The Board of Trustees of the Leland Stanford Junior University, Stanford, CA (US) --.
Item [56], References Cited, OTHER PUBLICATIONS, "William J. Dally et al., Abstract of "Transmitter Equalization for 4Gb/s Signalling" 10pp." should read -- William J. Dally et al., Abstract of "Transmitter Equalization for 4Gb/s Signalling", IEEE Micro, Vol. 17, No. 1, 1997, 10pp. --.
"Ramin Farjad-Rad et al., "A 0.4 –$\mu$m CMOS 10 Gb/s 4-PAM Pre-Emphasis Serial Link Transmitter", IEEE Journal of Solid-Stare Circuits, vol 34, No. 5, May 1999, pp. 580-585." should read -- A 0.4 –$\mu$m CMOS 10 Gb/s 4-PAM Pre-Emphasis Serial Link Transmitter", IEEE Journal of Solid-State Circuits, vol 34, No. 5, May 1999, pp. 580-585. --

Column 4,
Line 9, "up_b or down" should read -- *up_b* or *down* --.
Lines 14 and 18, "up_b and down" should read -- *up_b* and *down* --.
Line 21, "up_b/down" should read -- *up_b/down* --.

Signed and Sealed this

Fourteenth Day of December, 2004

JON W. DUDAS
*Director of the United States Patent and Trademark Office*